(12) United States Patent
Hongo et al.

(10) Patent No.: US 7,297,210 B2
(45) Date of Patent: Nov. 20, 2007

(54) PLATING APPARATUS

(75) Inventors: Akihisa Hongo, Tokyo (JP); Naoki Matsuda, Tokyo (JP); Xinming Wang, Tokyo (JP)

(73) Assignee: Ebara Corporation, Tokyo (JP)

( * ) Notice: Subject to any disclaimer, the term of this patent is extended or adjusted under 35 U.S.C. 154(b) by 102 days.

(21) Appl. No.: 10/481,448

(22) PCT Filed: Oct. 15, 2002

(86) PCT No.: PCT/JP02/10656

§ 371 (c)(1),
(2), (4) Date: May 19, 2004

(87) PCT Pub. No.: WO03/033765

PCT Pub. Date: Apr. 24, 2003

(65) Prior Publication Data

US 2004/0194698 A1 Oct. 7, 2004

(30) Foreign Application Priority Data

Oct. 17, 2001 (JP) ............................... 2001-319838

(51) Int. Cl.
*B05C 11/00* (2006.01)
(52) U.S. Cl. ...................... 118/602; 118/429
(58) Field of Classification Search ................ 118/429, 118/667, 602, 603, 612, 600; 427/437, 438, 427/345; 204/236, 239, 241, 232, DIG. 13; 205/101

See application file for complete search history.

(56) References Cited

U.S. PATENT DOCUMENTS

| | | | | |
|---|---|---|---|---|
| 2,658,839 A | * | 11/1953 | Talmey et al. | ............... 427/438 |
| 2,819,188 A | * | 1/1958 | Metheny et al. | ............. 427/438 |
| 2,941,902 A | * | 6/1960 | Talmey et al. | ............... 427/345 |
| 2,963,002 A | * | 12/1960 | Glaus | .......................... 118/602 |
| 3,067,060 A | * | 12/1962 | Glaus | .......................... 427/345 |
| 3,451,374 A | * | 6/1969 | Jarvi et al. | ................... 118/694 |
| 3,620,189 A | * | 11/1971 | Hood et al. | ................. 118/620 |
| 3,900,599 A | * | 8/1975 | Feldstein | .................... 427/97.7 |
| 6,027,567 A | * | 2/2000 | Suzuki | ........................ 118/600 |

FOREIGN PATENT DOCUMENTS

| | | |
|---|---|---|
| EP | 0890658 | 1/1999 |
| JP | 63-83282 | 4/1988 |
| JP | 11-12746 | 1/1999 |

* cited by examiner

*Primary Examiner*—Brenda Lamb
(74) *Attorney, Agent, or Firm*—Wenderoth, Lind & Ponack, L.L.P.

(57) ABSTRACT

There is provided a plating apparatus which can keep a plating solution always in its optimal condition while minimizing the amount of plating solution used, and which can easily form a uniform plated film on the plating surface of a workpiece.

The plating apparatus includes: a plating solution supply system (70) for constantly circulating a plating solution while heating the plating solution in a circulation tank (80) provided with a heating apparatus (78*a*), and supplying a predetermined amount of plating solution to a plating treatment section (24) when carrying out plating treatment; a plating solution recovery system (72) for recovering the plating solution after the plating treatment in the plating treatment section (24), heating the plating solution and returning the heated plating solution to the circulation tank (80); and a plating solution replenishment system (74) for replenishing the circulation tank (80) with a fresh plating solution or a plating solution component.

6 Claims, 8 Drawing Sheets

PLATING APPARATUS

FIELD OF THE INVENTION

This invention relates to a plating apparatus, and more particularly, to an electroless plating apparatus useful for forming an embedded interconnects that an electric conductor, such as copper or silver, is imbedded in fine recesses for interconnects formed in the surface of a substrate like a semiconductor substrate, and for forming a protective layer for protecting the surface of the interconnects.

DESCRIPTION OF RELATED ART

As an electroless plating apparatus, there has been generally known an apparatus comprising a plating bath for holding an electroless plating solution which overflows during a plating process, and a vertically movable holding portion disposed above the plating bath for holding a workpiece to be plated, such as a substrate, with a plating surface facing downwardly (facedown), whereby the workpiece held by the holding portion is dipped into the plating solution in the plating bath. Further, there has been also generally known a plating apparatus comprising a holding portion for holding a workpiece, such as a substrate, with the plating surface facing upwardly (faceup), and a plating solution supply portion (nozzle) for supplying a plating solution to an upper surface (plating surface) of the workpiece held by the holding portion, whereby the plating solution flows along the upper surface of the workpiece held by the holding portion.

In recent years, as the processing speed and integration of a semiconductor chip becomes higher, there has been a growing tendency to replace aluminum or aluminum alloy with copper having a low electric resistivity and a high electromigration resistance as metallic materials for forming interconnection circuits on the semiconductor substrate. These kind of copper interconnects are generally formed by filling fine recesses formed in the surface of the substrate with copper. As a method for forming the copper interconnects, CVD, sputtering, and plating are known, but plating is generally used. In any case, after a copper film is deposited on the surface of the substrate, the surface of the substrate is polished to a flat finish by a chemical mechanical polishing (CMP) process.

In the case of interconnects formed by such a process, the embedded interconnects have an exposed surface after the flattening processing. When an additional embedded interconnect structure is formed on such an exposed surface of interconnects of a semiconductor substrate, the following problems may be encountered. For example, during the formation of a new $SiO_2$ interlevel dielectric, the exposed surface of the pre-formed interconnects is likely to be oxidized. Further, upon etching of the $SiO_2$ layer for the formation of contact holes, the pre-formed interconnects exposed at the bottoms of the contact holes can be contaminated with an etchant, a peeled resist, etc. Moreover, in the case of copper interconnects, there is a fear of copper diffusion.

In view of this, in the case of copper interconnects, for example, it may be considered to selectively cover the surface of copper interconnects with a protective layer (plated film) of a Ni—B alloy or the like, having a good adhesion to copper and a low resistivity ($\rho$). A Ni—B alloy layer can be formed on the surface of e.g. copper selectively by using an electroless plating solution which contains nickel ions, a complexing agent for nickel ions and an alkylamine borane or a borohydride compound as a reducing agent for nickel ions and by immersing the surface of the substrate in the electroless plating solution.

An electroless plating is applied to main filling materials (Cu) for the copper interconnects, the formation of the seed layer on the barrier metal, or the reinforcement of the seed (Cu), further the formation of the barrier metal itself, or the formation of cap material for the copper interconnect (in any case, Ni—P, Ni—B, Co—P, Ni—W—P, Ni—Co—P, Co—W—P, Co—W—B), or the like. In any electroless plating process, uniformity of the film thickness over an entire surface of the substrate is required.

In the case of an electroless plating apparatus that employs a face-up system, the amount of a plating solution used in one plating treatment is relatively small. Accordingly, the plating treatment has generally been practiced in a so-called one-path (throwaway) manner in which the plating solution is thrown away after every plating treatment. This manner, however, increases the consumption of plating solution, leading to a high running cost.

It is therefore considered to employ a so-called circulatory manner in which a plating solution is circulated to recover and reuse it. A circulation/regeneration system for carrying out a circulatory manner of plating solution generally comprises a circulation tank for collecting a plating solution and circulating the plating solution. Thus, the plating solution in a predetermined amount, heated to a predetermined temperature in the circulation tank, is supplied to the plating surface of a workpiece to carry out plating, and the plating solution remaining on the plated surface of the workpiece after the plating is recovered and returned to the circulation tank.

Such a circulation/regeneration system, however, involves the following drawbacks:

In the production of a semiconductor device, for example, it is desired to use a plating solution containing a sodium-free reducing agent in order to avoid contamination with the alkali metal of the semiconductor device. A sodium-free reducing agent is generally unstable and susceptible to decomposition, especially when it is kept at a high temperature. Accordingly, a plating solution containing such a reducing agent, when collected and heated to a high temperature in the circulation tank which generally has a large volume, is likely to decompose, leading to a large consumption of the plating solution. Further, when the return plating solution recovered after plating is returned to the circulation tank in a batch-wise manner, the temperature of the plating solution held in the circulation tank changes, leading to production of plated films with various film thickness. Moreover, since the surface of the plating solution held in the circulation tank is in contact with air, oxygen in the air is taken in the plating solution to increase the amount of dissolved oxygen in the plating solution, which would suppress the reduction action of the reducing agent, leading to poor deposition of the plating. Contact of the plating solution with air can also promote the decomposition of the plating solution.

In order to reduce the consumption of a plating solution due to its decomposition at a high temperature, it may be considered to employ a so-called in-line heating according to which the plating solution is not heated in the circulation tank, but heated on its way to a workpiece only in an amount necessary for one plating treatment. With such in-line heating, however, control of the plating solution temperature is generally difficult and, in addition, a relatively large heating apparatus, such as a heater, is needed for heating the plating solution, leading to a large-sized apparatus. In case a small heating apparatus, such as a heater, is used to down size the apparatus, it becomes necessary to increase the temperature difference between the temperature of the surface of the heat source and the temperature of plating solution. This can lead to formation of products on the surface of the heat source, and also to decomposition of the plating solution by excessive heating of the plating solution locally in the vicinity of the heat source.

BRIEF SUMMARY OF THE INVENTION

The present invention has been made in view of the above situation in the related art. It is therefore an object of the present invention to a provide a plating apparatus which can keep a plating solution always in its optimal condition while minimizing the amount of plating solution used, and which can easily form a uniform plated film on the plating surface of a workpiece.

In order to achieve the above object, the present invention provides a plating apparatus comprising: a plating solution supply system for constantly circulating a plating solution while heating the plating solution in a circulation tank provided with a heating apparatus, and supplying a predetermined amount of plating solution to a plating treatment section when carrying out plating treatment; a plating solution recovery system for recovering the plating solution after the plating treatment in the plating treatment section, heating the plating solution and returning the heated plating solution to the circulation tank; and a plating solution replenishment system for replenishing the circulation tank with a fresh plating solution or a plating solution component.

According to the plating apparatus, while the plating solution heated in the circulation tank is kept circulated in a non-plating time, the plating solution at a lowered temperature remaining in the plating treatment section after plating is recovered and heated, and returned to the circulation tank. Further, the circulation tank is replenished with a fresh plating solution or a component (components) of plating solution through the plating solution replenishment system. A plating solution circulation/regeneration system, which uses a minimum amount of plating solution, is thus established. The system can minimize the consumption of a plating solution due to its decomposition at a high temperature.

The plating solution supply system may include a plating solution storage tank for allowing the plating solution to pass therethrough midway of its circulation and storing a predetermined amount of plating solution, and supplying the predetermined amount of plating solution to the plating treatment section when carrying out plating treatment. When carrying out e.g. electroless nickel or cobalt alloy plating for the formation of a protective film on the surface of a wafer, the necessary amount of plating solution is about 100-200 cc for a wafer with a diameter of 200 mm, and about 200-400 cc for a wafer with a diameter of 300 mm. By the provision of the storage tank, such a necessary amount (predetermined amount) of plating solution at a constant temperature can be supplied to the plating treatment section without lowering of the plating solution temperature.

According to a preferred embodiment, the plating solution supply system includes a main flow path that allows the plating solution to pass through the plating solution storage tank, and then either returns the plating solution to the circulation tank for circulation or supplies the plating solution to the plating treatment section, and a bypass flow path that branches off from the main flow path upstream of the plating solution storage tank, bypasses the plating solution storage tank and joins the main flow path. Further, the plating solution stored in the plating solution storage tank is supplied by free fall (the force of gravity) to the plating treatment section. When carrying out plating treatment, a predetermined amount (e.g. 350 cc) of plating solution stored in the plating solution storage tank can be supplied by free fall, i.e. by its own weight (gravity), in a moment of time (e.g. 1-5 seconds).

It is preferred that the circulation tank be connected to an inert gas introduction section for introducing an inert gas into the circulation tank and purging the inside of the circulation tank. This can effectively prevent air from contacting the surface of the plating solution in the circulation tank. In this regard, if air contacts the surface of the plating solution, oxygen in the air is taken in the plating solution to increase the amount of dissolved oxygen in the plating solution, which would suppress the reduction action of a reducing agent, leading to poor deposition of the plating. Such a drawback can be obviated by purging the inside of the circulation tank with an inert gas. The inert gas may, for example, be $N_2$ gas.

The plating solution recovery system may include an intermediary tank for temporarily storing and heating the recovered plating solution. The recovered plating solution can be heated to a predetermined temperature in the intermediary tank, and the thus heated plating solution can be returned to the circulation tank.

It is preferred that the intermediary tank be connected to an inert gas introduction section for introducing an inert gas into the intermediary tank and purging the inside of the intermediary tank. This can effectively prevent air contacting the surface of the plating solution in the intermediary tank. If air contacts the surface of the plating solution, oxygen in the air is taken in the plating solution to increase the amount of dissolved oxygen in the plating solution, which would suppress the reduction action of a reducing agent, leading to poor deposition of the plating. Such a drawback can be obviated by purging the inside of the intermediary tank with an inert gas.

The plating solution replenishment system may include a preparation tank for previously mixing plating solution components and heating the mixture. With the preparation tank, it becomes possible to prepare a fresh solution (plating solution) by mixing plating solution components and to supply (replenish) the circulation tank with the fresh solution previously heated to a predetermined temperature. This can prevent a change of the plating solution temperature in the circulation tank upon replenishment of the fresh solution.

It is preferred that the preparation tank be connected to an inert gas introduction section for introducing an inert gas into the preparation tank and purging the inside of the preparation tank. This can effectively prevent air contacting the surface of the fresh solution in the preparation tank. If air contact the surface of the fresh solution, oxygen in the air is taken in the fresh solution to increase the amount of dissolved oxygen in the fresh solution, and therefore increase the amount of dissolved oxygen in the plating solution replenished with such fresh solution, which would suppress the reduction action of a reducing agent, leading to poor deposition of the plating. Such a drawback can be obviated by purging the inside of the preparation tank with an inert gas.

According to the plating apparatus of the present invention, the total amount of the plating solution held in the plating solution supply system and the plating solution recovery system is preferably set at 0.1 to 1.0 times the amount of plating solution used in plating per hour. The use of such a small amount of plating solution makes it possible to use a circulation tank of a small volume, and can lower the running cost.

It is also preferred that 5 to 50% of the total amount of the plating solution held in the plating solution supply system and the plating solution recovery system be thrown away periodically or at an arbitrary time, and the shortage be replenished with the fresh plating solution from the plating solution replenishment system. This makes it possible to control the metal ion concentration of the plating solution, while is held in the circulation tank and kept circulated, within a predetermined range and also control the amount of decomposition products at a certain level, leading to a stable quality of the plated film and a lowering of the running cost.

The above and other objects, features, and advantages of the present invention will be apparent from the following description when taken in conjunction with the accompanying drawings which illustrates preferred embodiments of the present invention by way of example.

DETAILED DESCRIPTION OF PREFERRED EMBODIMENTS

Preferred embodiments of the present invention will now be described in detail with reference to the accompanying drawings, which in no way limit the invention.

Figure 1A:
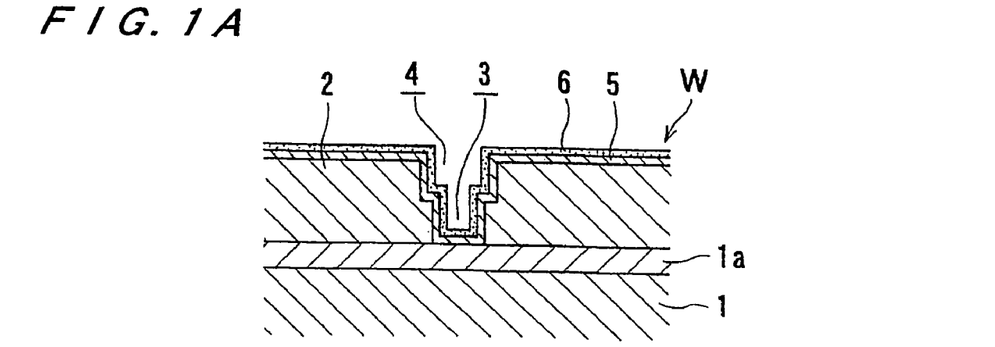
FIGS. 1A through 1D are diagrams illustrating, in sequence of process steps, an example of the formation of copper interconnects and the formation of protective layer for the copper interconnects.

FIGS. 1A through 1D illustrate, in sequence of process steps, an example of the formation of copper interconnects in a semiconductor device. As shown in FIG. 1A, an insulating film 2 of e.g. $SiO_2$ is deposited on a conductive layer 1a in which semiconductor devices are provided, which is formed on a semiconductor base 1. Contact holes 3 and trenches 4 for interconnects are formed in the insulating film 2 by the lithography/etching technique. Thereafter, a barrier layer 5 of TaN or the like is formed on the entire surface, and a copper seed layer 6 as an electric supply layer for electroplating is formed on the barrier layer 5, for example, by sputtering.

Figure 1B:
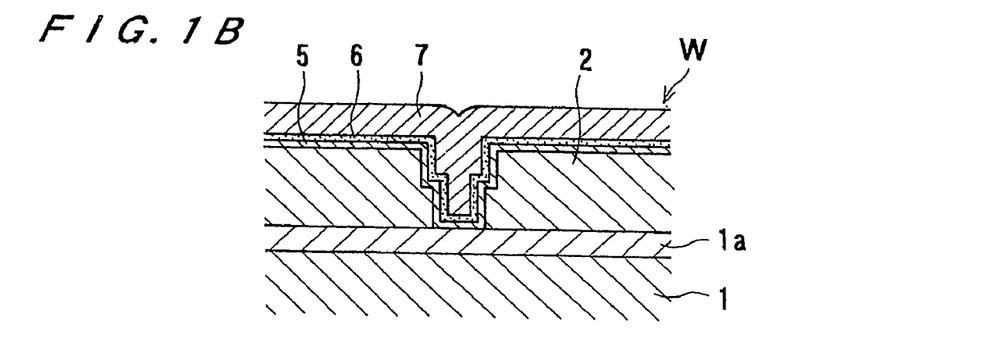
Figure 1C:
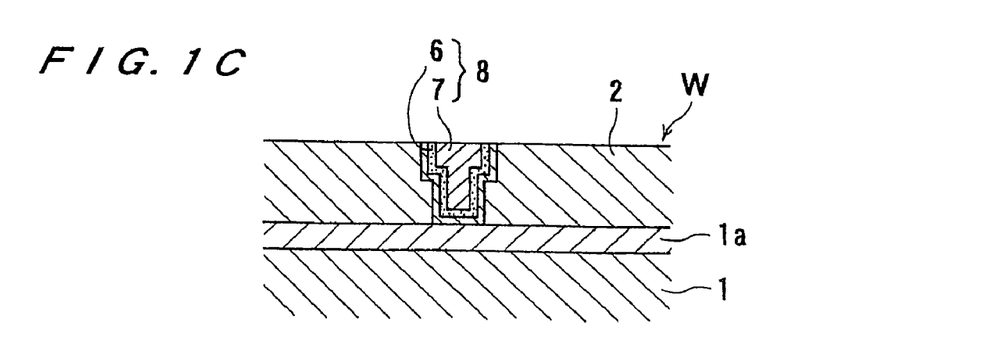
Figure 1D:
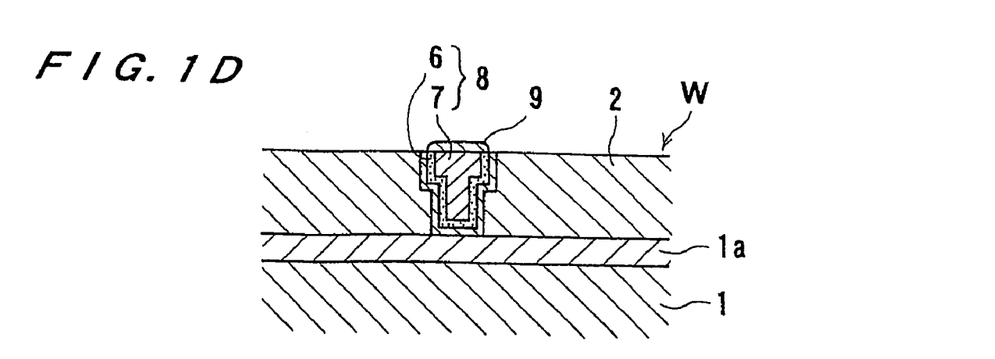

Thereafter, as shown in FIG. 1B, copper plating is carried out onto the surface of the semiconductor substrate W to fill the contact holes 3 and the trenches 4 with copper and, at the same time, deposit a copper film 7 on the insulating film 2. Thereafter, the copper film 7 on the insulating film 2 is removed by chemical mechanical polishing (CMP) so as to make the surface of the copper film 7 filled in the contact holes 3 and the trenches 4 for interconnects and the surface of the insulating film 2 lie substantially on the same plane. Interconnects 8 composed of the copper seed layer 6 and the copper film 7, as shown in FIG. 1C, are thus formed in the insulating layer 2. Next, electroless Ni—B plating, for example, is carried out onto the surface of the substrate W to form a protective layer (plated film) 9 composed of a Ni—B alloy selectively on the exposed surface of copper interconnects 8 to protect the interconnects 8, as shown in FIG. 1D.

Figure 2:
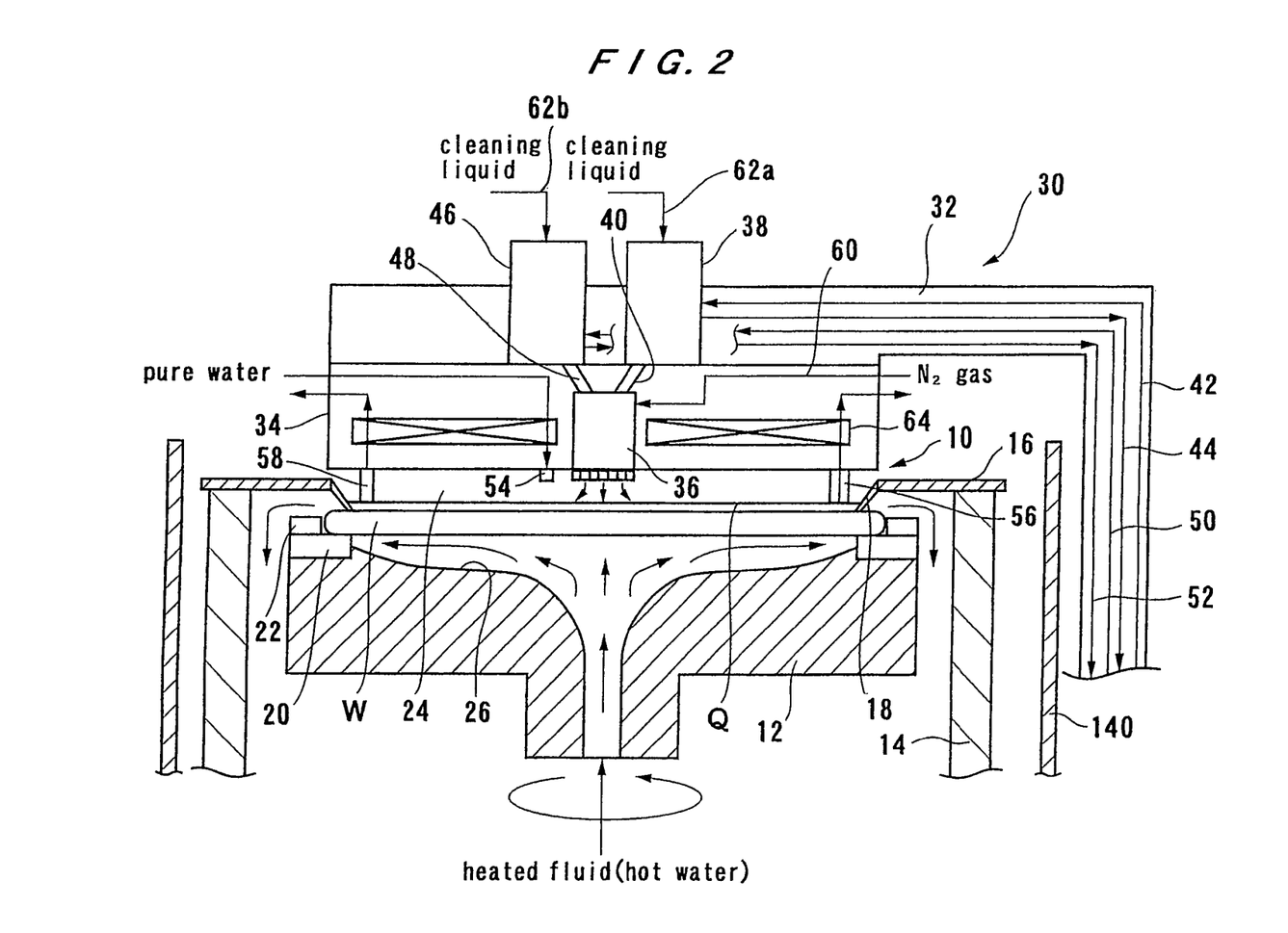
FIG. 2 is a cross-sectional view of an electroless plating apparatus according to a first embodiment of the present invention.
Figure 4:
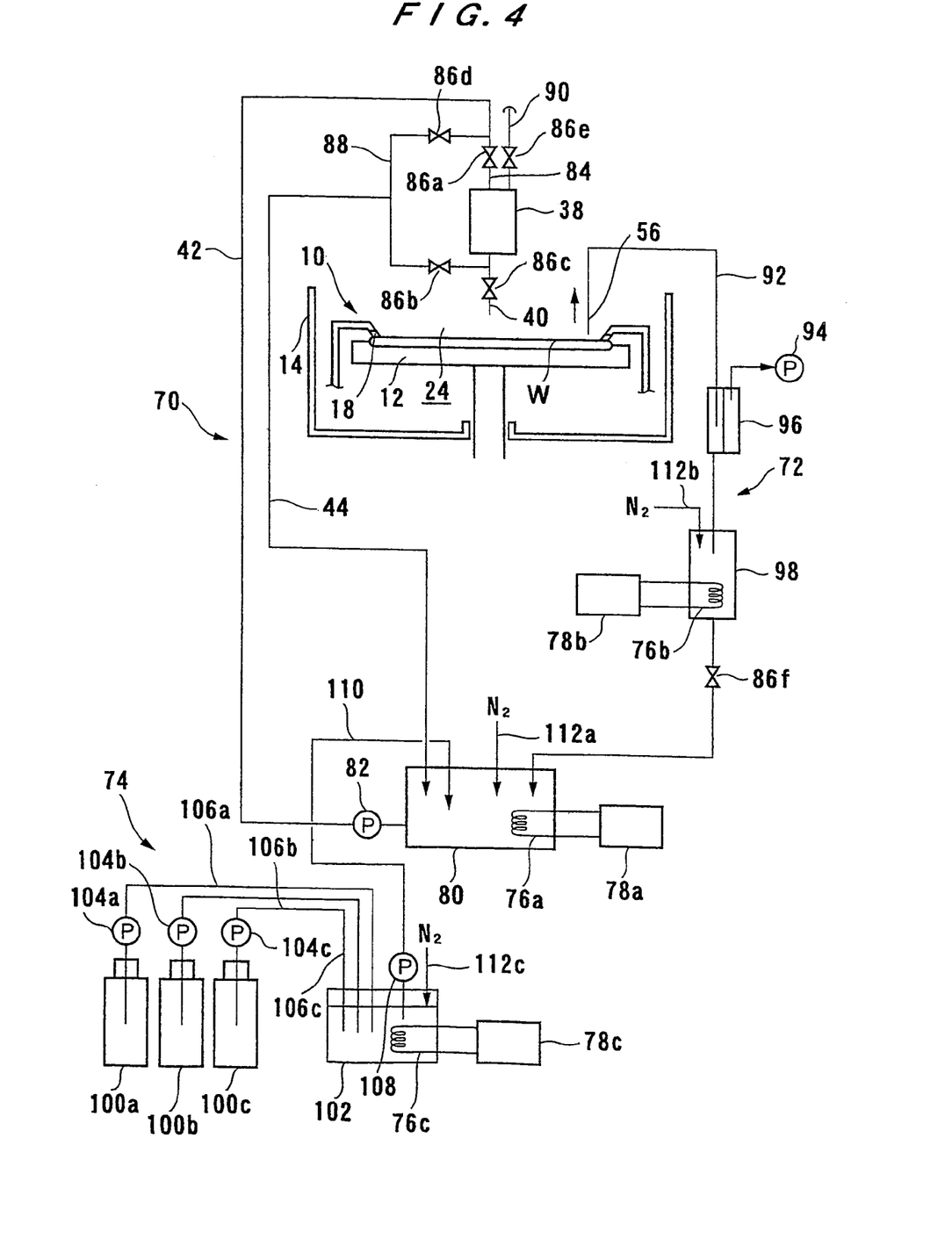
FIG. 4 is a diagram showing the general construction of the plating solution circulation/regeneration system of the electroless plating apparatus.

FIGS. 2 and 4 show an electroless plating apparatus according to an embodiment of the present invention. The electroless plating apparatus can be used, for example, for the formation of the barrier layer 5 of FIG. 1, the reinforcement of the copper seed layer 6 and the deposition of the copper film 7, and also for the formation of the protective layer (plated film) 9.

The electroless plating apparatus includes a substrate holder 10 for holding a substrate (to-be-processed workpiece) W, such as a semiconductor wafer, with its front surface (to-be-plated surface) facing upward. The substrate holder 10 is composed mainly of a treatment bath 12 having a heated fluid holding portion 26 that holds a heated fluid for heating the substrate W, as described below, and of a cylindrical housing 14 that surrounds the treatment bath 12. A hollow disk-shaped supporting plate 16 is mounted on the upper end of the housing 14. A seal ring 18 that protrudes downwardly is supported to an inner peripheral surface of the supporting plate 16.

A ring-shaped substrate stage 20 for supporting a peripheral portion of the substrate W and a guide ring 22, which is positioned at the periphery of the substrate W and prevents misalignment of the substrate W, are mounted on a peripheral portion of the upper surface of the treatment bath 12. The treatment bath 12 can move up and down relative to the housing 14. A substrate W is inserted into the housing 14 when the treatment bath 12 is in a lowered position relative to the housing 14, and the substrate W is placed and held on the upper surface of the substrate stage 20. Thereafter, the treatment bath 12 is raised relative to the housing 14 so as to bring the seal ring 18 into pressure contact with a peripheral portion of the upper surface of the substrate W to thereby seal the peripheral portion of the upper surface of the substrate and hold the substrate W, whereby a plating treatment section 24 is formed which is surrounded by the upper surface of the substrate W and by the seal ring 18 and which is open upwardly. Release of the holding of the substrate W can be made by the adverse operation. With the substrate W held by the substrate holder 10, the treatment bath 12 and the housing 14 can rotate together by the actuation of a motor (not shown).

In the upper surface of the treatment bath 12, there is provided a heated fluid holding portion 26 for holding a heated fluid, e.g. a heated water, alcohol or organic solution, and allowing the heated fluid to contact the lower surface of the substrate W to heat the substrate W. The heated fluid holding portion 26 is composed of a flow channel which is open upwardly and in the shape of a bugle in section, and is connected to a fluid supply pipe which has on its way e.g. a pure water heating section (heater) for heating pure water to e.g. 70° C. The heated fluid overflowing the heated fluid holding portion 26 passes between the treatment bath 12 and the housing 14 and flows out to the outside. Further, a scattering-proof cover 140 for preventing scattering of the heated fluid is provided around the housing 14.

Figure 3:
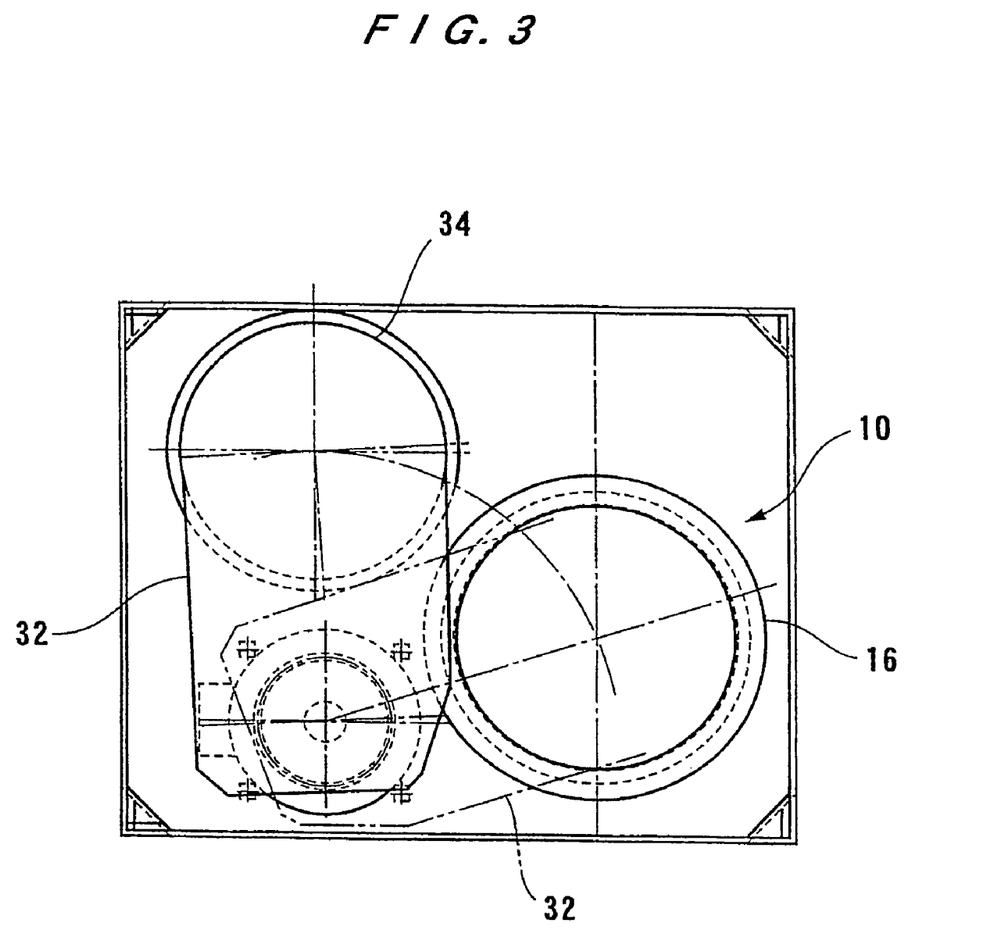
FIG. 3 is a plan view of the electroless plating apparatus.

Positioned above the substrate holder 10, there is provided a plating solution supply section 30 for supplying a plating solution (electroless plating solution) Q heated to a predetermined temperature, e.g. 70° C., into the plating treatment section 24 formed by the upper surface of the substrate W and the seal ring 18. The plating solution supply section 30 has a vertically-movable, pivotable pivot arm 32, and a disk-shaped head section 34, which almost covers the opening of the plating treatment section 24 and is mounted on the free end of the pivot arm 32. By the pivoting of the pivot arm 32, as shown in FIG. 3, the head section 34 moves between the position covering the substrate holder 10 and the retreat position. Thus, the head section 34 is located in the position covering the upper surface of the substrate W held by the substrate holder 10 while the plating treatment is carried out, and is moved to the retreat position after the plating treatment, thereby preventing the head section 34 from impeding transfer of the substrate W.

In the central portion of the head section 34, there are provided a downwardly-opened plating solution supply nozzle 36 and, positioned above the plating solution supply nozzle 36, a plating solution storage tank 38 having such a volume that can store a predetermined amount of plating solution necessary for one plating treatment. The plating solution supply nozzle 36 and the plating solution storage tank 38 are connected to each other by a plating solution pipe 40. A plating solution supply pipe 42 and a plating solution discharge pipe 44 are connected to the plating solution storage tank 38. In a non-plating time, as described below, the plating solution is circulated into the plating solution storage tank 38 so as to store a predetermined amount of plating solution at a constant temperature in the plating solution storage tank 38. At the time of plating, the plating solution held in the plating solution storage tank 38 is supplied, by its own weight (the force of gravity), through the plating solution supply nozzle 36 into the plating treatment section 24, formed by the upper surface of the substrate W and the seal ring 18, in a moment of time (e.g. 1-10 seconds).

Positioned above the plating solution supply nozzle 36, there is also provided a pre-plating treatment liquid storage tank 46 for storing a pre-plating treatment liquid, such as a cleaning liquid for carrying out a pre-plating cleaning or a catalyst-imparting liquid for carrying out a catalyst-imparting treatment. The pre-plating treatment liquid storage tank 46 and the plating solution supply nozzle 36 are connected to each other by a pre-plating treatment liquid pipe 48. A pre-plating treatment liquid supply pipe 50 and a pre-plating treatment liquid discharge pipe 52 are connected to the pre-plating treatment liquid storage tank 46. As in the case of the plating solution, a predetermined amount of pre-plating treatment liquid at a constant temperature is stored in the pre-plating treatment storage tank 46 in a non-pretreatment time, and at the time of pre-plating treatment, the pre-plating treatment liquid stored in the pre-plating treatment storage tank 46 is supplied, by its own weight (gravity), through the plating solution supply nozzle 36 into the plating treatment section 24, formed by the upper surface of the substrate W and the seal ring 18, in a moment of time (e.g. 1-10 seconds). Though in this embodiment the plating solution supply nozzle 36 is used also as a pre-plating treatment liquid supply nozzle, it is possible to separately provide such nozzles. In the case where a plurality of pre-plating treatments are carried out, it is of course possible to provide a plurality of pre-plating treatment liquid storage tanks, and sequentially supply pre-plating treatment liquids stored in the respective tanks to the plating surface of a substrate W.

The above construction of the electroless plating apparatus makes it possible to carry out the pretreatment, such as cleaning or a catalyst-imparting treatment, and the plating treatment successively in the single bath onto the substrate W held by the substrate holder 10. $H_2SO_4$, HF, HCl, $NH_3$, DMAB (dimethylamine borane), oxalic acid, etc. may be used as a cleaning liquid for carrying out the pre-plating cleaning, and $PdSO_4$, $PdCl_2$, etc. may be used as a catalyst-imparting liquid for carrying out the catalyst-imparting treatment.

The head section 34 is provided with a pure water supply nozzle 54 for supplying pure water to the upper surface (plated surface) of the substrate W held by the substrate holder 10. By supplying pure water from the pure water supply nozzle 54 to the surface of the substrate after the plating treatment, the plating treatment of the substrate and rinsing of the plated substrate with pure water can be carried out successively in the single bath.

The head section 34 is provided with a plating solution recovery nozzle 56 for recovering the plating solution which has been supplied to the plating surface of the substrate W held by the substrate holder 10. The plating solution remaining in the plating treatment section 24, after plating treatment, is recovered by the plating solution recovery nozzle 56 and reused, as described bellow. The head section 34 is also provided with a pre-plating treatment liquid recovery nozzle 58 for recovering the pre-plating treatment liquid which has been supplied to the plated surface of the substrate W held by the substrate holder 10. The pre-plating treatment liquid is recovered by the pre-plating treatment liquid recovery nozzle 58, and is reused according to necessity.

An inert gas introduction line (inert gas introduction section) 60 for introducing a heated inert gas, e.g. $N_2$ gas, is connected to the plating solution supply nozzle 36. The heated inert gas introduced from the inert gas introducing line 60 into the plating solution supply nozzle 36, after purging the inside of the plating solution supply nozzle 36, is jetted toward the substrate W held by the substrate holder 10. Thus, the inert gas is introduced into the space between the substrate W held by the substrate holder 10 and the head section 34 which is in the position covering the upper surface of the substrate W, whereby the space is brought to the inert gas atmosphere at a predetermined temperature. This can effectively prevent air from contacting the surface of the plating solution. In this regard, if air contacts the surface of the plating solution, oxygen in the air is taken in by the plating solution to increase the amount of dissolved oxygen in the plating solution, which would restrain the reduction action of a reducing agent, leading to poor deposition of the plating. Such a drawback can be obviated by bringing the above space to an inert gas atmosphere. Further, by keeping the space under the atmosphere of heated inert gas, the temperature of the plating solution can be prevented from being lowered during plating. When the temperature of the plating solution is 70° C., for example, the temperature of the inert gas, such as $N_2$ gas, is generally 60 to 70° C. (temperature of plating solution −10° C. to temperature of plating solution), preferably 65 to 70° C. (temperature of plating solution −5° C. to temperature of plating solution).

A cleaning liquid introduction line (cleaning liquid introduction section) 62a is connected to the plating solution storage tank 38, and a cleaning liquid introduction line (cleaning liquid introduction section) 62$b$ is connected to the pre-plating treatment liquid storage tank 46. A cleaning liquid from the cleaning liquid introduction line 62$a$ flows through the plating solution storage tank 38, the plating solution pipe 40 and the plating solution nozzle 36 in this order; and a cleaning liquid from the cleaning liquid introduction line 62$b$ flows through the pre-plating treatment liquid storage tank 46, the pre-plating treatment liquid pipe 48 and the plating solution supply nozzle 36 in this order. Extraneous matter adhering to the inner wall surfaces of these tanks, pipes and nozzles can thus be cleaned off. The cleaning may be practiced periodically or at an arbitrary time. Pure water or a cleaning chemical, such as $HNO_3$, aqua regia or HF, may be used as the cleaning liquid. According to this embodiment, the head section 34 has a built-in heater 64 for keeping the heat-retaining space between the substrate W held by the substrate holder 10 and the head section 34 nearly at the temperature of the plating solution.

FIG. 4 shows the general construction of a plating solution circulation/regeneration system of the electroless plating apparatus. The plating solution circulation/regeneration system is composed mainly of a plating solution circulation system which consists of a plating solution supply system 70 and a plating solution recovery system 72 and which circulates a plating solution, and a plating solution replenishment system 74 which replenishes the plating solution circulation system with a fresh solution (plating solution).

The plating solution supply system 70 includes the above-described plating solution storage tank 38, a plating solution supply pipe 42 and a plating solution discharge pipe 44, both connected to the plating solution storage tank 38, and a plating solution pipe 40. The plating solution supply pipe 42 and the plating solution discharge pipe 44 are connected to a circulation tank 80 which is provided with a heating apparatus (heater) 78$a$ having e.g. a hot-water heat exchanger 76$a$. A circulation pump 82 is provided in the plating solution supply pipe 42. A main flow path 84 is thus provided which, by the actuation of the circulation pump 82, introduces the plating solution in the circulation tank 80 into the plating solution storage tank 38 through the plating solution supply pipe 42, and then either returns the plating solution to the circulation tank 80 for circulation through the plating solution discharge pipe 44 or supplies the plating solution in the plating solution storage tank 38 to the plating treatment section 24 through the plating solution pipe 40. The plating solution in the circulation tank 80 is heated by the heating apparatus 78$a$ to a predetermined temperature, e.g. 70° C.

On the upstream and downstream sides of the plating solution storage tank 38, there are interposed open/close valves 86$a$, 86$b$ respectively in the plating solution supply pipe 42 and in the plating solution discharge pipe 44. Further, an open/close valve 86$c$ is interposed in the plating solution pipe 40.

The plating solution supply system 70 also includes a bypass flow path 88 that branches off from the main flow path 84 upstream of the open/close valve 86$a$ disposed upstream of the plating solution storage tank 38, bypasses the plating solution storage tank 38 and joins the main flow path 84 downstream of the open/close valve 86$b$ disposed downstream of the plating solution storage tank 38. An open/close valve 86$d$ is interposed in the bypass flow path 88. An air vent pipe 90, in which an open/close valve 86$e$ is interposed, is connected to the plating solution storage tank 38.

In a non-plating time, the open/close valves 86$a$, 86$b$ are opened, and the other open/close valves 86$c$, 86$d$, 86$e$ are closed, thereby circulating the plating solution heated to a predetermined temperature through the plating solution supply pipe 42, the plating solution storage tank 38 and the plating solution discharge pipe 44. Immediately before supplying the plating solution to the plating treatment section 24, only the open/close valve 86$d$ is opened and the other open/close valves 86$a$-86$c$, 86$e$ are closed, thereby bypassing the plating solution through the bypass flow path 88 and storing a predetermined amount of plating solution in the plating solution storage tank 38. By opening then the open/close valves 86$c$, 86$e$, the predetermined amount of plating solution stored in the plating solution storage tank 38 is supplied by free fall, i.e. by its own weight (gravity), through the plating solution supply nozzle 36 (see FIG. 2) to the plating solution treatment section 24 in a moment of time (e.g. 1-10 seconds).

The plating solution recovery system 72 includes a plating solution recovery pipe 92 which is connected to the above-described plating solution recovery nozzle 56. The plating solution recovery pipe 92 is connected to the circulation tank 80. In the plating solution recovery pipe 92 are disposed, in the order of return of the plating solution, a vapor-liquid separator 96 which can evacuate by a vacuum pump 94, an intermediary tank 98 provided with a heating apparatus (heater) 78$b$ having e.g. a hot-water heat exchanger 76$b$ and an open/close valve 86$f$.

Accordingly, by the actuation of the vacuum pump 94, the plating solution remaining in the plating treatment section 24 after plating enters the vapor-liquid separator 96, and the separated liquid (plating solution) enters the intermediary tank 98. The plating solution in the intermediary tank 98 is heated to the same predetermined temperature as the plating solution in the circulation tank 80, e.g. 70° C., and is returned to the circulation tank 80 by opening the open/close valve 86$f$. By thus heating the return plating solution before returning it to the circulation tank 80, the temperature of the plating solution in the circulation tank 80 can be prevented from being changed (lowered) upon return of the plating solution.

The plating solution replenishment system 74 includes a plurality of plating solution component supply tanks 100$a$, 100$b$ . . . and a preparation tank 102 provided with a heating apparatus (heater) 78$c$ having e.g. a hot-water heat exchanger 76$c$. The respective plating solution component supply tanks 100$a$, 100$b$ . . . and the preparation tank 102 are connected by plating solution component supply pipes 106$a$, 106$b$ . . . having supply pumps 104$a$, 104$b$, respectively. Further, the preparation tank 102 and the circulation tank 80 are connected by a fresh solution supply pipe 110 having a fresh solution supply pump 108.

The plating solution component supply tanks 100$a$, 100$b$ . . . comprise at least three tanks respectively holding a reducing agent solution, a pH adjustment agent solution and a solution containing a metal material and other components. In the case of Ni—B electroless plating, for example, the plating solution component supply tank 100$a$ holds a solution containing DMAB (dimethylamine borane) as a reducing agent for nickel ions, the plating solution component supply tank 100$b$ holds a solution containing TMAH (tetramethylammoniumhydroxide) as a pH adjusting agent, and the plating solution component supply tank 100$c$ holds a solution containing Ni ions and other components.

The respective plating solution components held in the plating solution component supply tanks 100$a$, 100$b$ . . . are supplied to the preparation tank 102, where the components are mixed to prepare a fresh solution (plating solution). The fresh solution is heated to a predetermined temperature, e.g. 70° C., and the heated fresh solution is supplied to the circulation tank 80 to replenish the plating solution. By thus heating the fresh solution to a predetermined temperature before adding it to the plating solution in the circulation tank 80, the temperature of the plating solution in the circulation tank 80 can be prevented from being charged (lowered) upon addition of the fresh solution.

Figure 6:
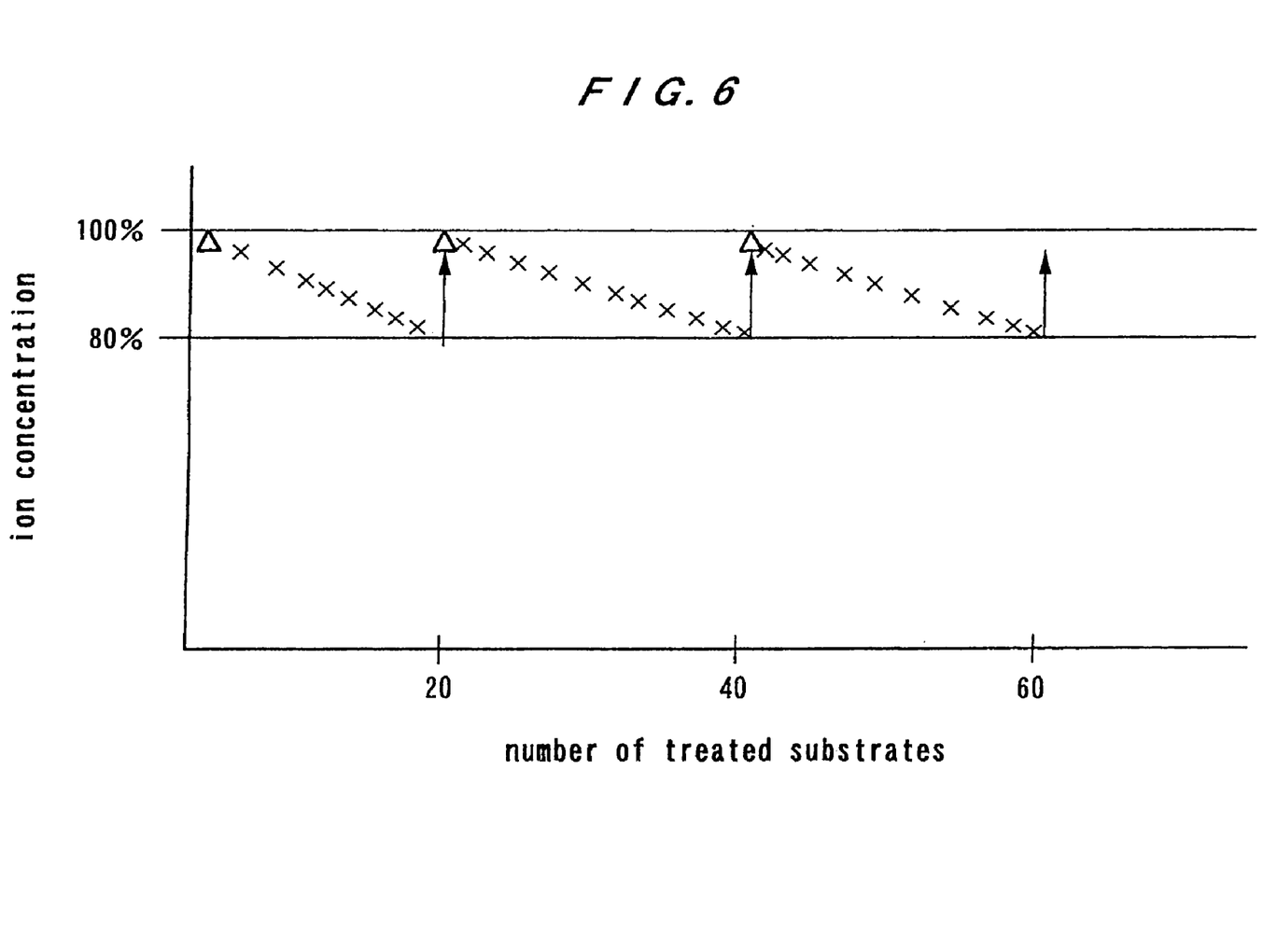
FIG. 6 is a diagram illustrating control of the metal ion concentration of a plating solution by replenishment of a fresh solution (plating solution)

By carrying out the replenishment of the fresh solution periodically or at an arbitrary time, the concentration of a metal ion, e.g. Ni ion, can be controlled within a certain management range. Consider now as an example a case of depositing 70 nm-thick Ni on the entire surface of a wafer, with the condition that the total amount of plating solution in the plating solution circulation system is one liter. In this case, though depending on the Ni concentration of the plating solution, the Ni concentration is assumed to be lowered by about 20% (from 100% to 80%) after plating treatment of 20 wafers without replenishment of the plating solution. In such a case, a fresh plating solution (replenisher) having a certain Ni concentration, which is higher than the basic concentration, is prepared. A certain amount (e.g. 0.4 L) of the one-liter plating solution in the circulation system is thrown away periodically, i.e. in this case every time 20 wafers have been treated, as shown in FIG. 6. At the same time, the plating solution circulation system is replenished with the fresh plating solution in a amount corresponding to the total of the amount of the plating solution thrown away and the amount of the plating solution consumed in the plating treatment. This makes it possible to control the Ni concentration of the plating solution within a certain management range (within 20% in this case). It is preferred that 5 to 50% of the total amount of the plating solution in the plating solution circulation system be thrown away periodically.

The above-described circulation tank 80, intermediary tank 98 and preparation tank 102 are respectively connected to inert gas introduction lines (inert gas introduction sections) 112a, 112b, 112c for purging the insides of the tanks 80, 98, 102 by inert gas. This can effectively prevent air contacting the surface of the plating solution in the tank 80, 98 or 102. If air contacts the surface of the plating solution, oxygen in the air is taken in by the plating solution to increase the amount of dissolved oxygen in the plating solution, which would suppress the reduction action of a reducing agent, leading to poor deposition of the plating. Such a drawback can be obviated by bringing the above tanks to an inert gas atmosphere. The inert gas may, for example, be $N_2$ gas.

According to the plating solution circulation/regeneration system, while the plating solution heated in the circulation tank 80 is kept circulated in a non-plating time, the plating solution at a lowered temperature remaining in the plating treatment section 24 after plating is recovered and heated, and returned to the circulation tank 80. Further, the circulation tank 80 is replenished with a fresh plating solution or a component (components) of plating solution from the plating solution replenishment system 74. The plating solution circulation/regeneration system thus uses a minimum amount of plating solution, and can minimize the consumption of a plating solution due to its decomposition at a high temperature. Moreover, the plating solution circulation/regeneration system, which uses a minimum amount of plating solution, makes it possible to set the total amount of the plating solution held in the plating solution circulation system, consisting of the plating solution supply system 70 and the plating solution recovery system 72, at e.g. 0.1-1.0 times the amount of plating solution used in plating per hour, and use a circulation tank 80 having a small volume that meets such a small amount of plating solution. This can reduce the consumption of plating solution and can downsize the apparatus.

Figure 5:
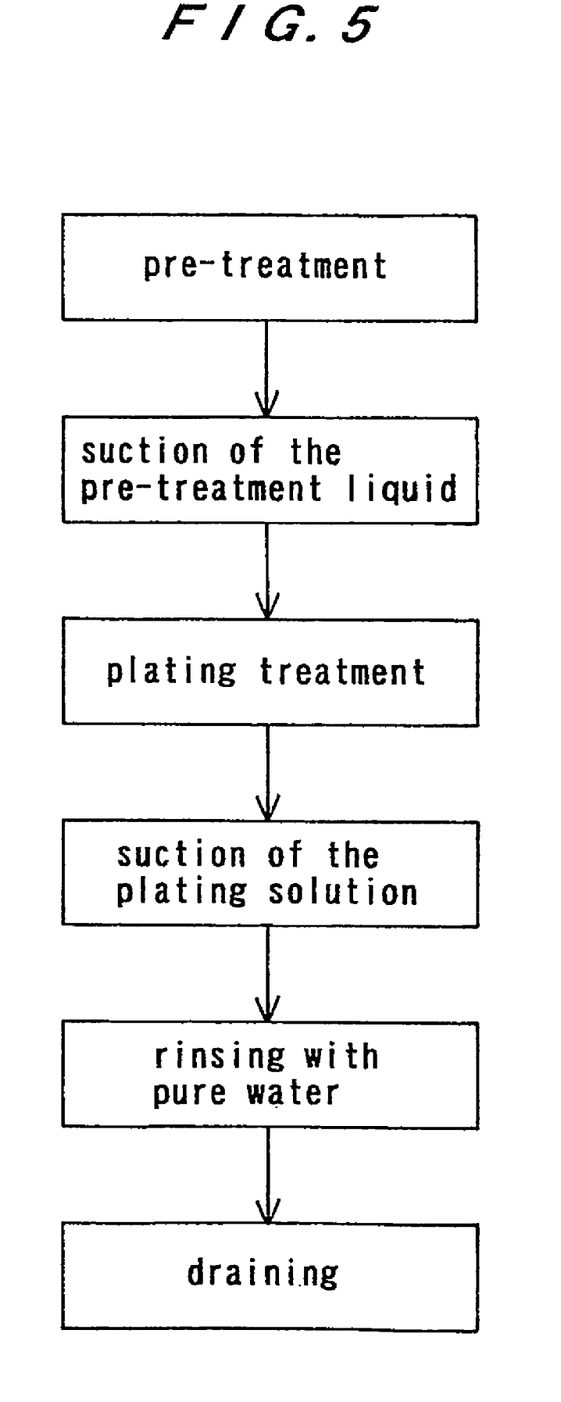
FIG. 5 is a flow chart illustrating the process steps of plating treatments as performed by the electroless plating apparatus.

A description will now be given of the plating treatment by the electroless plating apparatus of this embodiment with reference to FIGS. 4 and 5. First, a substrate W is inserted into the housing 14 when the treatment bath 12 is in a lowered position relative to the housing 14, and the substrate W is placed and held on the upper surface of the substrate stage 20. At this time, the head section 34 is located at the retreat position. Thereafter, the treatment bath 12 is raised relative to the housing 14 so as to bring the seal ring 18 into pressure contact with a peripheral portion of the upper surface of the substrate W to thereby seal the peripheral portion of the upper surface of the substrate W and hold the substrate W, whereby a plating treatment section 24 is formed which is surrounded by the upper surface of the substrate W and by the seal ring 18 and which is open upwardly.

Next, the head section 34 is moved to the position right above the substrate holder 10, and is then lowered. Thereafter, a predetermined amount of pre-plating treatment liquid, such as a cleaning liquid or a catalyst-imparting liquid, held in the pre-plating treatment liquid storage tank 46 is supplied, by its own weight (gravity), through the plating solution supply nozzle 36, which is used also as a pre-plating treatment liquid supply nozzle, to the plating surface of the substrate held by the substrate holder 10 in a moment of time, thereby carrying out pre-plating treatment. After completion of the pre-plating treatment, the pre-plating treatment liquid remaining on the plating surface of the substrate W is recovered by the pre-plating treatment liquid recovery nozzle 58, and is reused according to necessity.

Next, a heated fluid, such as a hot water, heated to the same temperature as the plating solution, e.g. 70° C., is introduced into the heated fluid holding portion 26 of the treatment bath 12, and the heated fluid is allowed to contact the lower surface of the substrate W held by the substrate holder 10 and then overflow. When the substrate W is heated by the heated fluid to reach the same temperature as the heated fluid, e.g. 70° C., a predetermined amount of plating solution (e.g. about 100-200 cc for a wafer with 200-mm diameter, and about 200-400 cc for a wafer with 300-mm diameter) at a predetermined temperature, held in the plating solution storage tank 38, is supplied, by its own weight (gravity), through the plating solution supply nozzle 36 to the plating surface of the substrate held by the substrate holder 10 in a moment of time, thereby carrying out plating treatment.

Before the supply of the plating solution, as described above, the open/close valves 86a, 86b are opened, and the other open/close valves 86c, 86d, 86e are closed, thereby circulating the plating solution heated to a predetermined temperature through the plating solution supply pipe 42, the plating solution storage tank 38 and the plating solution discharge pipe 44. Immediately before supplying the plating solution to the plating treatment section 24, only the open/close valve 86d is opened and the other open/close valves 86a-86c, 86e are closed, thereby bypassing the plating solution through the bypass flow path 88 and storing the predetermined amount of plating solution in the plating solution storage tank 38. By then opening the open/close valves 86c, 86e, the predetermined amount of plating solution stored in the plating solution storage tank 38 is supplied by free fall, i.e. by its own weight (gravity), through the plating solution supply nozzle 36 (see FIG. 2) to the plating solution treatment section 24 in a moment of time (e.g. 1-10 seconds).

Upon the plating treatment, a heated inert gas is introduced from the inert gas introduction line 60 into the plating solution supply nozzle 36. The heated inert gas, after purging the inside of the plating solution supply nozzle 36, is introduced into the space between the substrate W held by the substrate holder 10 and the head section 34 in the position covering the upper surface of the substrate W so as to keep the space under the inert gas atmosphere at a predetermined temperature.

Further, as necessary, the plating solution is heated by the heater 64 to prevent lowering of the temperature of the plating solution during plating. During the plating treatment, the substrate W is thus kept at the temperature of the heated fluid over the entire surface, whereby a plated film having a uniform film thickness is allowed to grow. Moreover, since the peripheral portion of the substrate W is also kept immersed in the heated fluid, the temperature of the peripheral portion also is not lowered. During the plating, it is possible to rotate the substrate W so as to make the release of hydrogen gas and the concentration of dissolved oxygen uniform over the plating surface.

After completion of the plating treatment, the introduction of the heated fluid into the heated fluid holding portion 26 is stopped and the heated fluid is discharged from the introduction side, and the plating solution remaining in the plating treatment section 24, surrounded by the seal ring 18 and the upper surface of the substrate W, is recovered, e.g. by suction, through the plating solution recovery nozzle 56. Thus, the substrate W is rotated to gather on its peripheral portion the plating solution remaining in the plating treatment section 24 after plating, and the gathered plating solution is sucked by the plating solution recovery nozzle 56. The plating solution containing a gas enters the gas-liquid separator 96, and only the separated liquid (plating solution) enters the intermediary tank 98. The plating solution in the intermediary tank 98 is heated to the same temperature as the plating solution in the circulation tank 80, e.g. 70° C. By opening the open/close valve 86f, the heated plating solution is returned to the circulation tank 80.

The introduction of the inert gas from the inert gas introduction line 60 is stopped. Thereafter, while rotating the substrate W, pure water is jetted from the pure water supply nozzle 54 toward the plated surface of the substrate W to cool the plated surface and, at the same time, dilute and clean the plated surface, thereby terminating the electroless plating reaction. The substrate W is then rotated at a high speed for draining.

Thereafter, the head section 34 is raised and retreated to the retreat position, and then the treatment bath 12 is lowered relative to the housing 14 to thereby release the holding of the substrate W. Thereafter, the plated substrate is sent, e.g. by a hand of a robot, to the next process step.

According to the plating apparatus of this embodiment, plating treatment is carried out to one substrate in the above-described manner. When the number of the treated substrates W has reached a given number (e.g. 20), as described above, a given amount (e.g. 0.4 L) of plating solution is thrown away from the plating solution circulation system, and the system is replenished with a fresh plating solution having a certain concentration of metal ion, e.g. Ni ion, in an amount corresponding to the total of the amount of the plating solution thrown away and the amount of the plating solution consumed in the plating treatment, to thereby control the concentration of metal ion, e.g. Ni ion, within a desired management range. This makes it possible to carry out plating treatment in a continuous manner.

Figure 7:
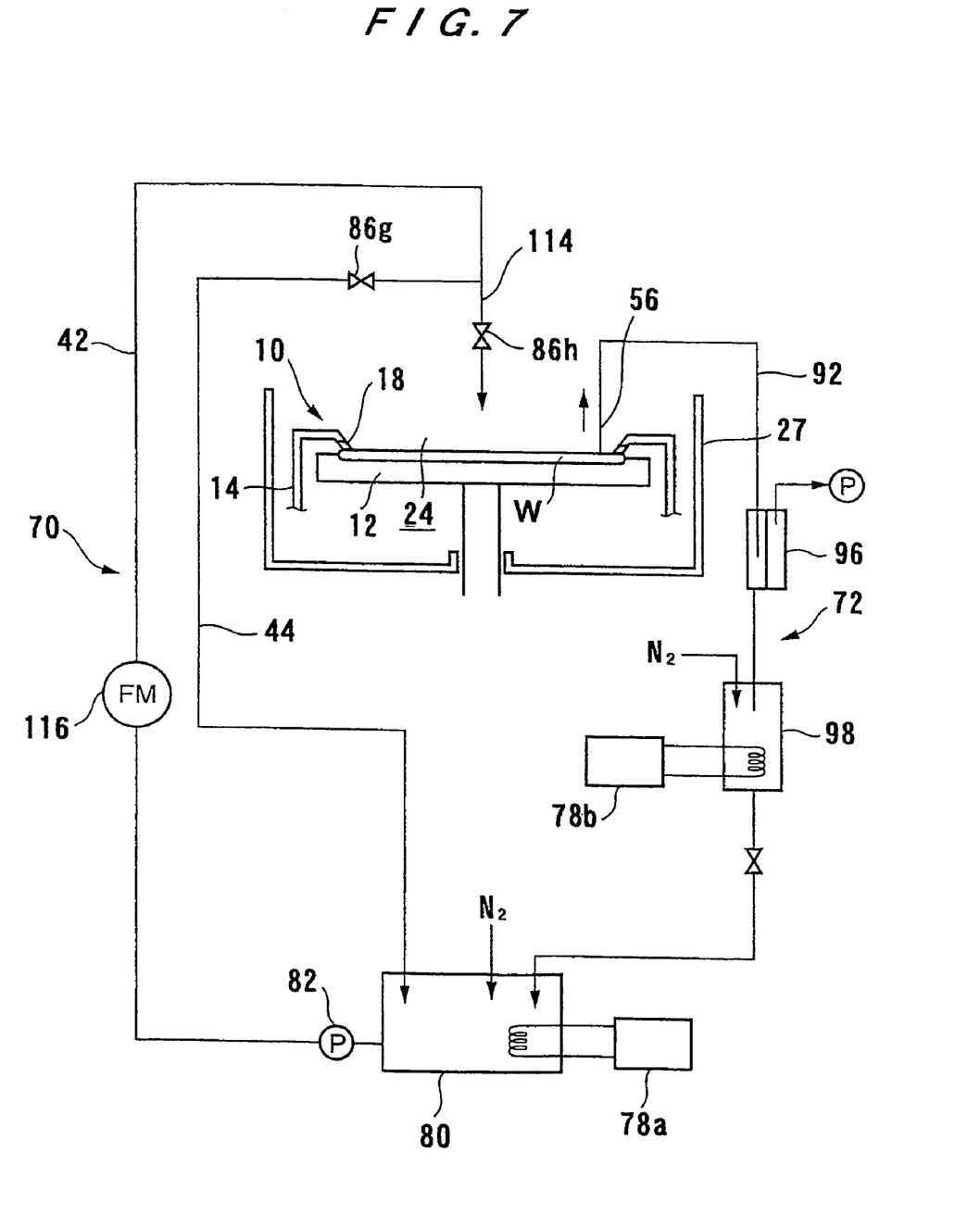
FIG. 7 is a diagram showing part of the plating solution circulation/regeneration system of an electroless plating apparatus according to a second embodiment of the present invention.

FIG. 7 shows part of the plating solution circulation/regeneration system of an electroless plating apparatus according to a second embodiment of the present invention. According to this embodiment, the plating solution storage tank 38 (see FIGS. 2 and 4) is omitted, and a predetermined amount of plating solution is supplied to the plating treatment section 24 based on a measurement of the flow of plating solution in the plating solution supply pipe. Specifically, the plating solution supply system 70 includes the plating solution supply pipe 42 and the plating solution discharge pipe 44, communicating with each other, and a downwardly-oriented plating solution ejection pipe 114 disposed above the plating treatment section 24. A flowmeter 116 is interposed in the plating solution supply pipe 42. Open/close valves 86g, 86h are interposed respectively in the plating solution discharge pipe 44 and in the plating solution ejection pipe 114. The other construction is the same as the electroless plating apparatus of the first embodiment.

According to this embodiment, in a non-plating time, the open/close valve 86g is opened and the open/close valve 86h is closed, thereby circulating the plating solution through the plating solution supply pipe 42 and the plating solution discharge pipe 44. When carrying out plating treatment, the open/close valve 86g is closed and the open/close valve 86h is opened, and the flow amount of the plating solution flowing through the plating solution supply pipe 42 is measured with the flowmeter 116. When the measurement has reached a predetermined amount, the open/close valve 86g is opened and the open/close valve 86h is closed. The predetermined amount of plating solution is thus supplied to the plating treatment section 24.

Figure 8:
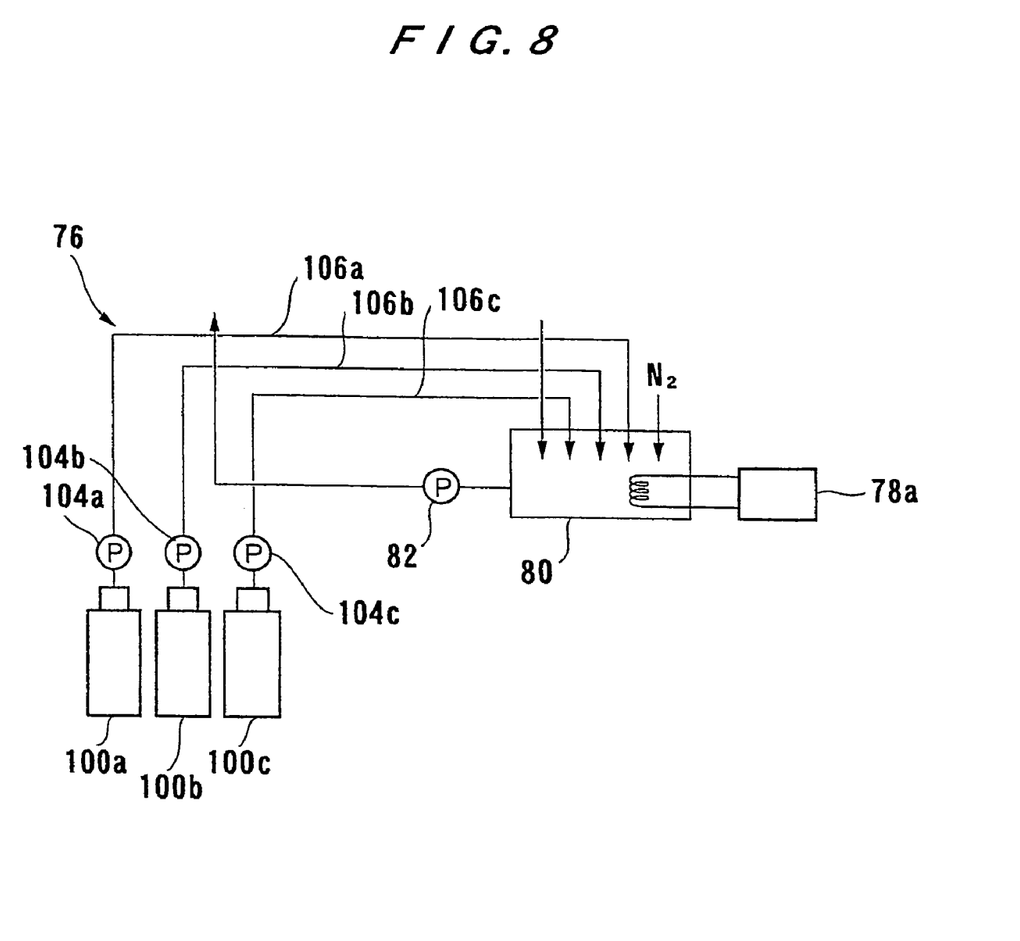
FIG. 8 is a diagram showing part of the plating solution circulation/regeneration system of an electroless plating apparatus according to a third embodiment of the present invention.

FIG. 8 shows part of the plating solution circulation/regeneration system of an electroless plating apparatus according to a third embodiment of the present invention. According to this embodiment, the preparation tank 102 (see FIGS. 2 and 4) according to the first embodiment is omitted. Thus, in the plating solution replenishment system 74 of this embodiment, the plating solution component supply tanks 100a, 100b . . . are directly connected to the circulation tank 80 by the plating solution component supply pipes 106a, 106b . . . The other construction is the same as the electroless plating apparatus of the first embodiment.

According to this embodiment, the plating solution circulation system can be replenished with a fresh solution (plating solution) by the direct supply of the respective plating solution components held in the plating solution supply tanks 100a, 100b . . . to the circulation tank 80.

According to the present invention, as described hereinabove, the plating solution circulation/regeneration system, which uses a minimum amount of plating solution, is established and the consumption of a plating solution due to its decomposition at a high temperature can be minimized.

Although certain preferred embodiments of the present invention have been shown and described in detail, it should be understood that various changes and modifications may be made therein without departing from the scope of the appended claims.

INDUSTRIAL APPLICABILITY

This invention relates to an electroless plating apparatus useful for forming embedded interconnects that an electric conductor, such as copper or silver, is imbedded in fine recesses for interconnects formed in the surface of a substrate like a semiconductor substrate, and for forming a protective layer for protecting the surface of the interconnects.

The invention claimed is:

1. A plating apparatus comprising:
    a plating solution supply system for constantly circulating a plating solution while heating the plating solution in a circulation tank provided with a heating apparatus, and for supplying a predetermined amount of plating solution stored in a plating solution storage tank disposed above a plating treatment section by free fall to the plating treatment section when carrying out plating treatment of a substrate;
    a plating solution recovery system for recovering the plating solution after the plating treatment in the plating treatment section and for returning the plating solution to the circulation tank; and
    a plating solution replenishment system for replenishing the circulation tank with fresh plating solution or a plating solution component;
    wherein the plating solution supply system includes a main flow path for allowing the plating solution to pass through the plating solution storage tank, and then for allowing the plating solution to return to the circulation tank for circulation or for supplying the plating solution to the plating treatment section, and a bypass flow path that branches off from the main flow path upstream of the plating solution storage tank so as to bypass the plating solution storage tank and re-joins the main flow path downstream of the plating solution storage tank.

2. The plating apparatus according to claim 1, wherein the circulation tank is connected to an inert gas introduction section for introducing an inert gas into the circulation tank and for purging the inside of the circulation tank.

3. The plating apparatus according to claim 1, wherein the plating solution supply system and the plating solution recovery system are structured such that the total amount of the plating solution held in the plating solution supply system and the plating solution recovery system is in a range of 0.1 to 1.0 times the amount of plating solution used in plating per hour.

4. The plating apparatus according to claim 1, wherein the heating apparatus comprises a first heating apparatus, and the plating solution recovery system includes a second heating apparatus for heating the recovered plating solution recovered by the plating solution recovery system.

5. The plating apparatus according to claim 4, wherein the plating solution recovery system includes an intermediary tank with the second heating apparatus arranged therein for temporarily storing and for heating the recovered plating solution.

6. The plating apparatus according to claim 5, wherein the intermediary tank is connected to an inert gas introduction section for introducing an inert gas into the intermediary tank and for purging the inside of the intermediary tank.

* * * * *